United States Patent
Manning

(10) Patent No.: US 6,407,955 B2
(45) Date of Patent: *Jun. 18, 2002

(54) INTEGRATED CIRCUIT HAVING AN ON-BOARD REFERENCE GENERATOR

(75) Inventor: Troy Manning, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/844,952

(22) Filed: Apr. 27, 2001

Related U.S. Application Data

(63) Continuation of application No. 09/233,774, filed on Jan. 19, 1999, now Pat. No. 6,288,954.

(51) Int. Cl.[7] .............................................. G11C 29/00
(52) U.S. Cl. .................... 365/201; 365/210; 365/205
(58) Field of Search ............................... 365/201, 210, 365/205

(56) References Cited

U.S. PATENT DOCUMENTS

| | | |
|---|---|---|
| 5,335,198 A | 8/1994 | Van Bushkirk et al. |
| 5,359,558 A | 10/1994 | Chang et al. |
| 5,933,366 A | 8/1999 | Yoshikawa |
| 5,956,277 A | 9/1999 | Roohparvar |
| 6,288,954 B1 * | 9/2001 | Manning ................. 365/201 |

OTHER PUBLICATIONS

IEEE Micro, Richard Crisp/Rambus, Inc., 1997, "Direct Rambus Technology: The New Main Memory Standard", pp. 18–28.
Direct RDRAM 128/144–Mbit (256Kx16/18x32s) Datasheet, Rambus, Inc./Frederick A. Ware, Aug., 1998, pp. 1–62.
Direct Rambus Technology Disclosure, Rambus, Inc., Oct., 1997, pp. 1–16.

* cited by examiner

Primary Examiner—Richard Elms
Assistant Examiner—Tuan T. Nguyen
(74) Attorney, Agent, or Firm—Michael L. Lynch; Graybeal Jackson Haley LLP

(57) ABSTRACT

An integrated circuit includes a differential amplifier having a first terminal that is operable to receive an input signal and having a second terminal. The integrated circuit also includes a reference circuit that generates a reference signal on the second terminal of the amplifier. During testing of the integrated circuit, the reference circuit can be activated to generate the reference signal such that a tester need not supply it as a test signal. During normal operation, however, either the reference circuit can generate the reference signal or the reference signal can be supplied by an external source.

21 Claims, 5 Drawing Sheets

INTEGRATED CIRCUIT HAVING AN ON-BOARD REFERENCE GENERATOR

This is a continuation of prior application Ser. No. 09/233,774, filed Jan. 19, 1999, now U.S. Pat. No. 6,288,954 the benefit of the filing date of which is hereby claimed under 35 USC 120.

TECHNICAL FIELD

The invention relates generally to electronic circuits, and more specifically to an integrated circuit (IC) having an on-board reference generator. For example, if the generator is on-board a memory circuit, one can activate the generator to provide an internal reference signal during a test mode of the memory circuit, and one can deactivate the generator to allow the memory circuit to receive an external reference signal during normal operation.

BACKGROUND OF THE INVENTION

Because it is generally true that the fewer signals needed to test an IC the higher and more efficient the testing throughput for a batch of the ICs, IC design engineers strive to minimize the number of signals needed to test an IC. For example, suppose that an IC tester has sixty signal probes. If each of the ICs being tested requires twenty test signals, then the tester can test three ICs at a time. If, however, each of the ICs requires twenty one test signals, then the tester can test only two ICs at a time. Thus in this example, just one extra test signal per IC decreases the testing throughput by one third. Furthermore, in the latter case, the IC tester is significantly under utilized, and thus the testing is relatively inefficient with respect to the tester, because eighteen signal probes (60-42) are unused during each test cycle.

FIG. 1 is a schematic diagram of a portion of a reduced-signal-level dynamic random access memory (DRAM) circuit 10 such as a Direct Rambus® DRAM (RDRAM®) specified by Rambus Inc. of Mountain View, Calif. The memory circuit 10 includes one or more terminals $12_0$–$12_n$ for receiving digital signals $S_0$–$S_n$, a reference terminal 14 for receiving a reference voltage Vref, and clock terminals 16a and 16b for receiving complimentary Clock From Master signals CFM and $\overline{CFM}$, respectively. Typically, Vref is half way between the logic 0 and logic 1 levels of $S_0$–$S_n$, to provide symmetrical noise margins. Also, CFM and $\overline{CFM}$ are typically derived from the rising and falling edges, respectively, of a single Master Clock (MC) signal (not shown) having a 50% duty cycle and the same frequency as CFM and $\overline{CFM}$. In one embodiment, the signals $S_0$–$S_n$ have logic 0=1.8 volts (V) and logic 1=1.0V, Vref=1.4V, and CFM and $\overline{CFM}$ each have a frequency of 400 megahertz (MHz).

The memory circuit 10 also includes differential input buffers $18_0$–$18_n$ and $20_0$–$20_n$ for converting the voltage levels of $S_0$–$S_n$ into voltage levels that are compatible with the circuitry (not shown) internal to the memory circuit 10. These buffers are arranged in pairs [$18_0$, $20_0$], . . . ,[$18_n$, $20_n$] for alternately sampling the signals $S_0$–$S_n$, respectively. Specifically, each buffer 18 receives a respective signal S on a non-inverting (+) terminal, Vref on an inverting (−) terminal, and CFM on a clock terminal 22. Similarly, each buffer 20 receives a respective signal S on a non-inverting terminal, Vref on an inverting terminal, and $\overline{CFM}$ on a clock terminal 24. Receiving the complimentary CFM and $\overline{CFM}$ signals instead of the MC signal provides the memory circuit 10 with two major advantages. First, although each buffer pair [18, 20] effectively samples a respective signal S on both the rising and falling edges—and thus at twice the frequency—of MC, each buffer of the pair operates at only half this sampling rate. Furthermore, each buffer of the pair is sensitive to the same clock-edge polarity, i.e., either rising or falling, and thus all the buffers 18 and 20 can have the same circuit design. Reducing the sampling rate of and using a single design for the buffers 18 and 20 often reduces the overall design and layout complexity of the memory circuit 10.

The memory circuit 10 also includes an IC package 21. The terminals $12_0$–$12_n$, 14, and 16a and 16b are disposed on the outside of the package 21, and the buffers $18_0$–$18_n$ and $20_0$–$20_n$, are disposed inside of the package 21.

In operation, using the input-buffer pair [$18_0$, $20_0$] and the signal values given above as examples, the buffer $18_0$ samples $S_0$ by comparing $S_0$ to Vref in response to the rising edge of CFM. If $S_0$ equals logic 0, i.e., 1.8 V, then the buffer $18_0$ generates a high output-voltage level, which the circuitry internal to the memory circuit 10 interprets as a logic 0. Conversely, if $S_0$ equals logic 1, i.e., 1.0 V, then the buffer $18_0$ generates a low output-voltage level, which the circuitry internal to the memory circuit 10 interprets as a logic 1. The buffer $20_0$ samples $S_0$ in response to the rising edge of $\overline{CFM}$ in a similar manner. The remaining input-buffer pairs [$18_1$, $20_1$], . . . ,[$18_n$, $20_n$] respectively sample $S_1$–$S_n$ in a similar manner.

Specific examples of the memory circuit 10 are described in more detail in the Advance Information sheet for the Direct RDRAM® 128/144-Mbit (256k×16/18×32S) and in other Rambus® publications, which are available from Rambus Incorporated of Mountain View, Calif. or from the Rambus website at www.rambus.com, and which are incorporated by reference herein.

Unfortunately, one must provide Vref to the terminal 14 during testing of the memory circuit 10 so that the differential input buffers 18 and 20 will function properly. Thus, as discussed above, providing Vref as a test signal may significantly lower the testing throughput and efficiency for a batch of the memory circuits 10.

SUMMARY OF THE INVENTION

In one aspect of the invention, an integrated circuit includes a differential amplifier having a first terminal that is operable to receive an input signal and having a second terminal. The integrated circuit also includes a reference circuit that generates a reference signal on the second terminal of the amplifier.

Therefore, during testing of such an IC, the tester can enable the on-board reference circuit to internally generate the reference signal such that the tester need not provide the reference signal. During normal operation, however, the IC can use the reference circuit to internally generate the reference signal or can receive the reference signal from an external source.

BRIEF DESCRIPTION OF THE DRAWINGS

A description of the various embodiments of the invention is made with reference to the following drawings where like reference numerals are used for like elements.

DETAILED DESCRIPTION OF THE INVENTION

Figure 1:
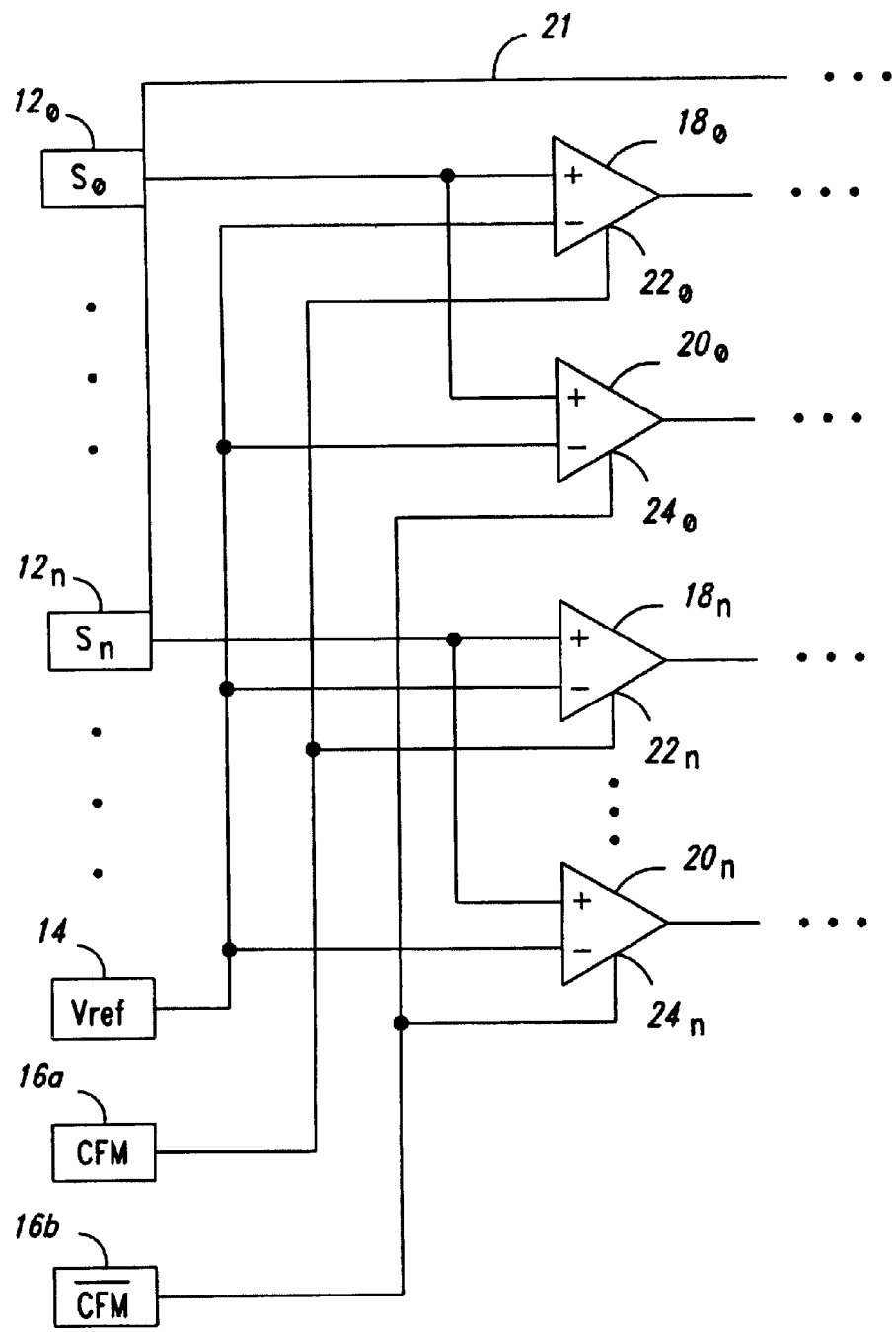
FIG. 1 is a schematic diagram of a portion of a conventional memory circuit.
Figure 2:
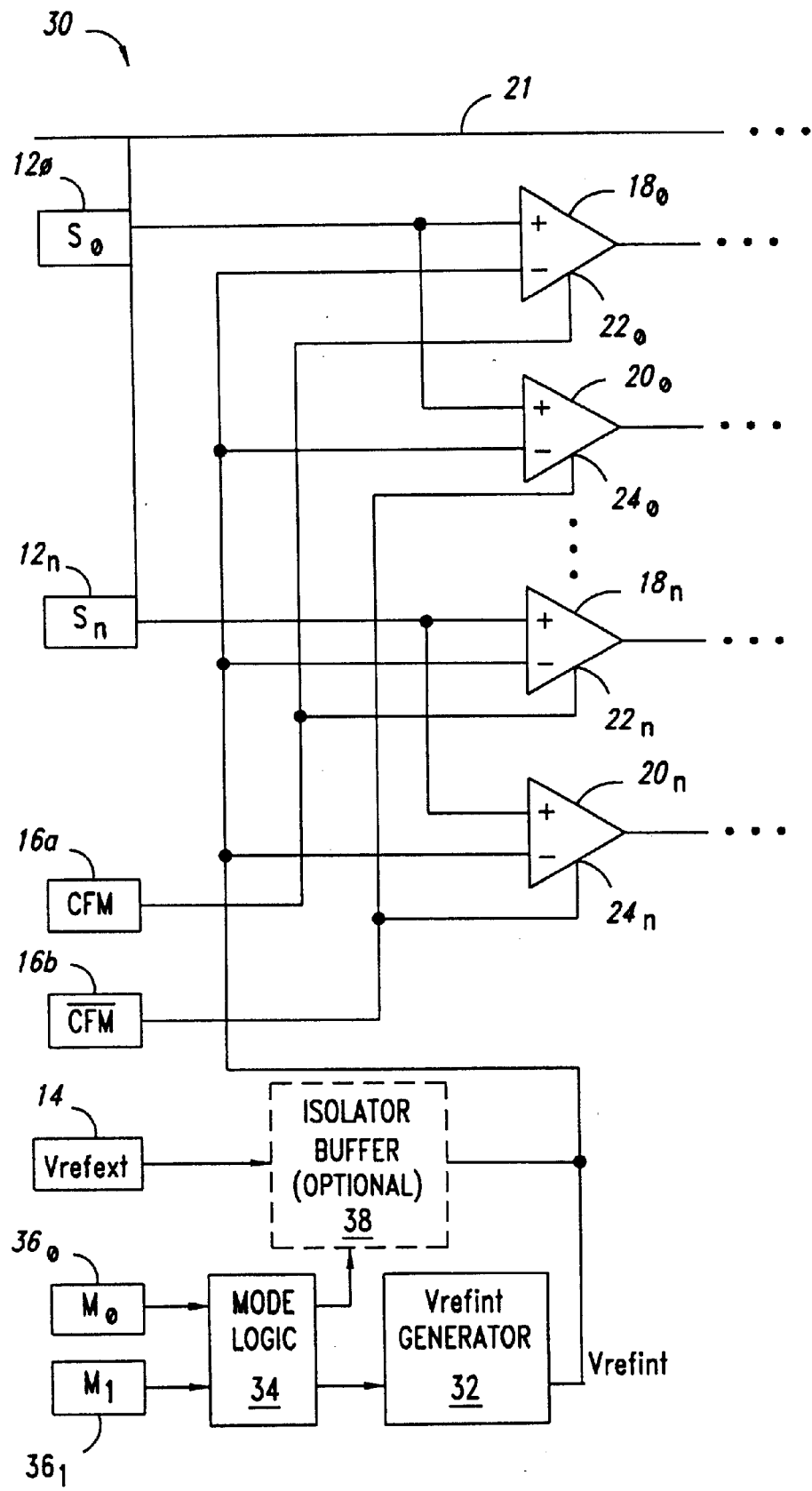
FIG. 2 is a schematic diagram of a portion of a memory circuit according to an embodiment of the invention.

FIG. 2 is a schematic diagram of a portion of a reduced-signal-level memory circuit 30 according to an embodiment of the invention. The memory circuit 30 is similar to the memory circuit 10 of FIG. 1 except that it includes an on-board reference-signal generator 32, which in one embodiment is used to internally generate a reference signal Vrefint during testing of the circuit 30. Furthermore, because system designers often want the flexibility of using a reference-signal value of their choice for certain other operational modes of the circuit 30, in one embodiment the circuit 30 receives an externally generated reference signal during operation in these other modes. Thus, in one embodiment, the circuit 30 accepts an externally generated reference signal during a normal mode of operation, but internally generates a reference signal during a test mode to reduce the number of test signals needed from the tester.

Like the memory circuit 10, the memory circuit 30 includes the terminals $12_0$–$12_n$ for respectively receiving the signals $S_0$–$S_n$, the reference terminal 14 for receiving an externally generated reference signal Vrefext, the complimentary clock terminals 16a and 16b for receiving CFM and $\overline{\text{CFM}}$, the buffer pairs [$18_0$, $20_0$], . . . ,[$18_n$, $20_n$] for respectively sampling $S_0$–$S_n$, and the package 21. The memory circuit 30 also includes terminals $36_0$ and $36_1$ for respectively receiving digital mode signals $M_0$ and $M_1$. A mode logic circuit 34 configures the internal circuitry of the circuit 30 and controls the generator 32 according to the operational mode indicated by $M_0$ and $M_1$. In one embodiment, the reference terminal 14 and the output terminal of the generator 32 are both directly connected to the buffers $18_0$–$18_n$ and $20_0$–$20_n$. In another embodiment, however, an optional isolation buffer 38, which is controlled by the mode logic 34, uncouples the terminal 14 from the output terminal of the generator 32 and from the buffers $18_0$–$18_n$ and $20_0$–$20_n$ if the generator 32 is enabled. The generator 32, mode logic 34, and buffer 38 are disposed inside of the package 21, and the terminals $36_0$ and $36_1$ are disposed outside of the package 21.

In operation, the buffers $18_0$–$18_n$ and $20_0$–$20_n$ sample $S_0$–$S_n$ as described above in conjunction with FIG. 1. Furthermore, during a first mode of operation such as a normal mode, the system in which the memory circuit 30 is installed provides Vrefext and values for $M_0$ and $M_1$ such that the mode logic circuit 34 deactivates the generator 32. If the buffer 38 is present, the mode circuit 34 enables it to couple Vrefext to the buffers $18_0$–$18_n$ and $20_0$–$20_n$. Conversely, during a second mode of operation such as a test mode, the system, which may include a tester, does not provide Vrefext and provides values for $M_0$ and $M_1$ such that the mode circuit 34 activates the generator 32 to generate Vrefint. If the buffer 38 is present, the mode circuit 34 disables it such that the terminal 14 is electrically isolated from the generator 32 and the buffers $18_0$–$18_n$ and $20_0$–$20_n$. Thus, the buffer 38 prevents damage to the generator 32 that otherwise might occur if the system drives a signal onto the terminal 14.

In addition to the above-described embodiment, other embodiments of the memory circuit 30 are also possible. For example, $S_0$–$S_n$ and Vref may be coupled to the inverting and non-inverting terminals of the respective buffers $18_0$–$18_n$ and $20_0$–$20_n$. Furthermore, although described as a DC voltage, the reference signal may be an AC voltage or an AC or DC current. Moreover, if a lower sampling frequency is acceptable, then the circuit 30 can receive a single clock signal and include single input buffers to respectively sample each signal $S_0$–$S_n$. Additionally, the circuit 30 may be designed to receive more or fewer mode signals M. Furthermore, the terminal 14 can be eliminated and the generator 32 permanently activated such that it generates Vref internally during all operational modes of the memory circuit 30.

Figure 3:
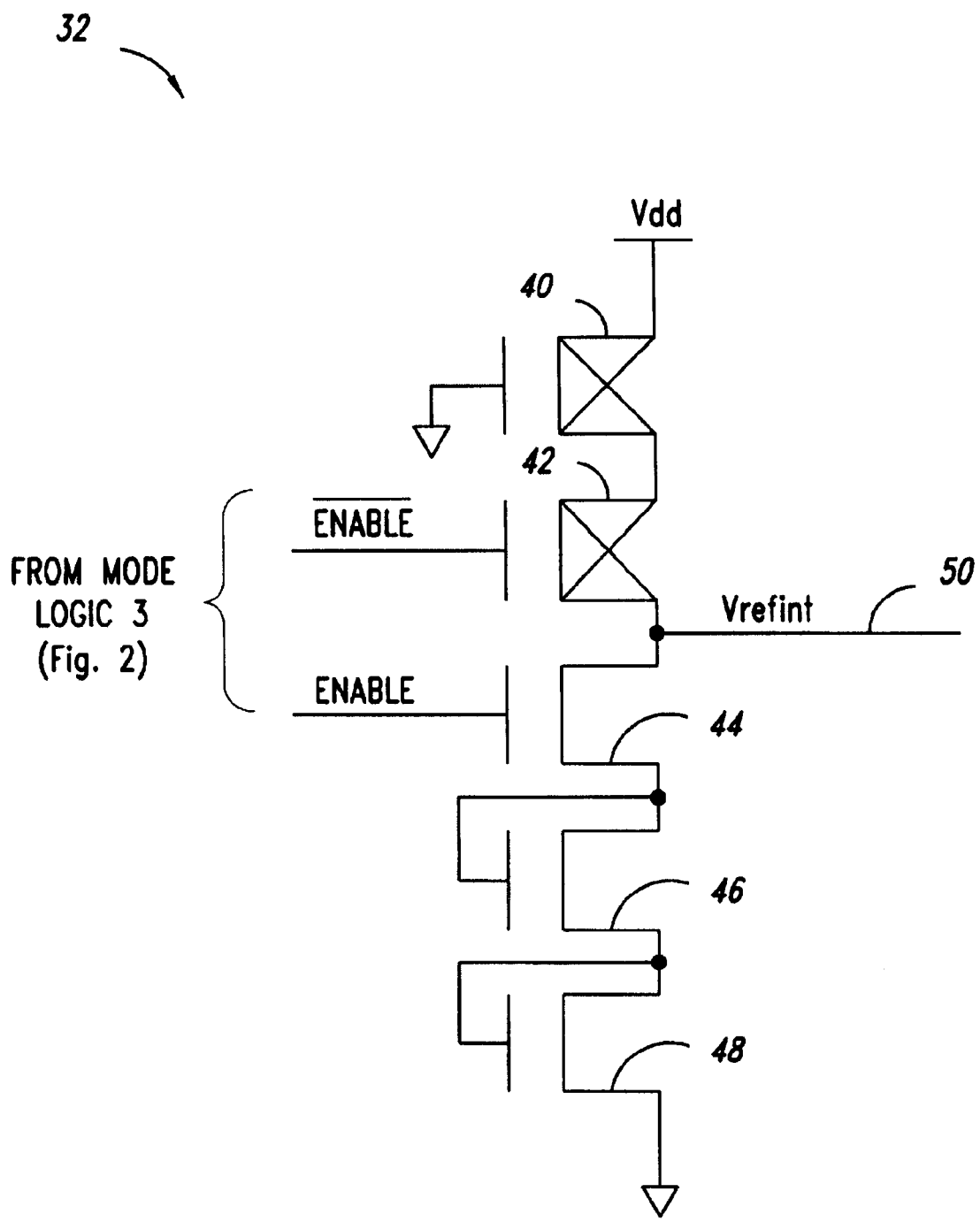
FIG. 3 is a schematic diagram of an embodiment of the reference-signal generator of FIG. 2.

FIG. 3 is a schematic diagram of an embodiment of the reference-signal generator 32 of FIG. 2. The generator 32 includes a relatively long-channel PMOS transistor 40, switching PMOS and NMOS transistors 42 and 44, and diode-connected NMOS transistors 46 and 48, which are all connected in series between a power-supply voltage VDD and ground. The gate of the transistor 40 is coupled to ground such that the transistor 40 acts as a high-impedance load to limit the current drawn by the generator 32. The gates of the transistors 42 and 44 respectively receive complementary enable signals $\overline{\text{ENABLE}}$ and ENABLE from the mode circuit 34 (FIG. 2), and turn the generator 32 on and off in response to these signals. The generator provides the reference signal Vrefint on an output terminal 50, which is at the junction of the drains of the transistors 42 and 44.

In an operational mode during which the memory circuit 30 receives an externally generated reference signal, the mode logic 34 generates $\overline{\text{ENABLE}}$ inactive logic 1 and ENABLE inactive logic 0 to deactivate the transistors 42 and 44 and thus to put the terminal 50 in a high-impedance state. This prevents a signal conflict at the inverting terminals of the buffers $18_0$–$18_n$ and $20_0$–$20_n$.

In an operational mode during which the memory circuit 30 internally generates a reference signal, the mode logic 34 generates $\overline{\text{ENABLE}}$ active logic 0 and ENABLE active logic 1 to activate the transistors 42 and 44 and thus to allow a current to flow through the transistors 46 and 48. The relatively high resistance of the transistor 40 limits this current to a desired level. While activated, the transistor 44 effectively acts as a short circuit such that Vrefint at the node 50 is approximately equal to the voltage across the transistors 46 and 48. Because the transistors 46 and 48 are diode connected, they generate drain-to-source voltage drops equal to their respective threshold voltages. Therefore, Vrefint approximately equals the sum of the threshold voltages of the transistors 46 and 48, which can be conventionally constructed to generate a desired value such as 1.4 V for Vrefint. go Although shown as a series combination of transistors, in other embodiments the generator 32 can be any other type of reference circuit that can generate Vrefint having a desired value.

Figure 4:
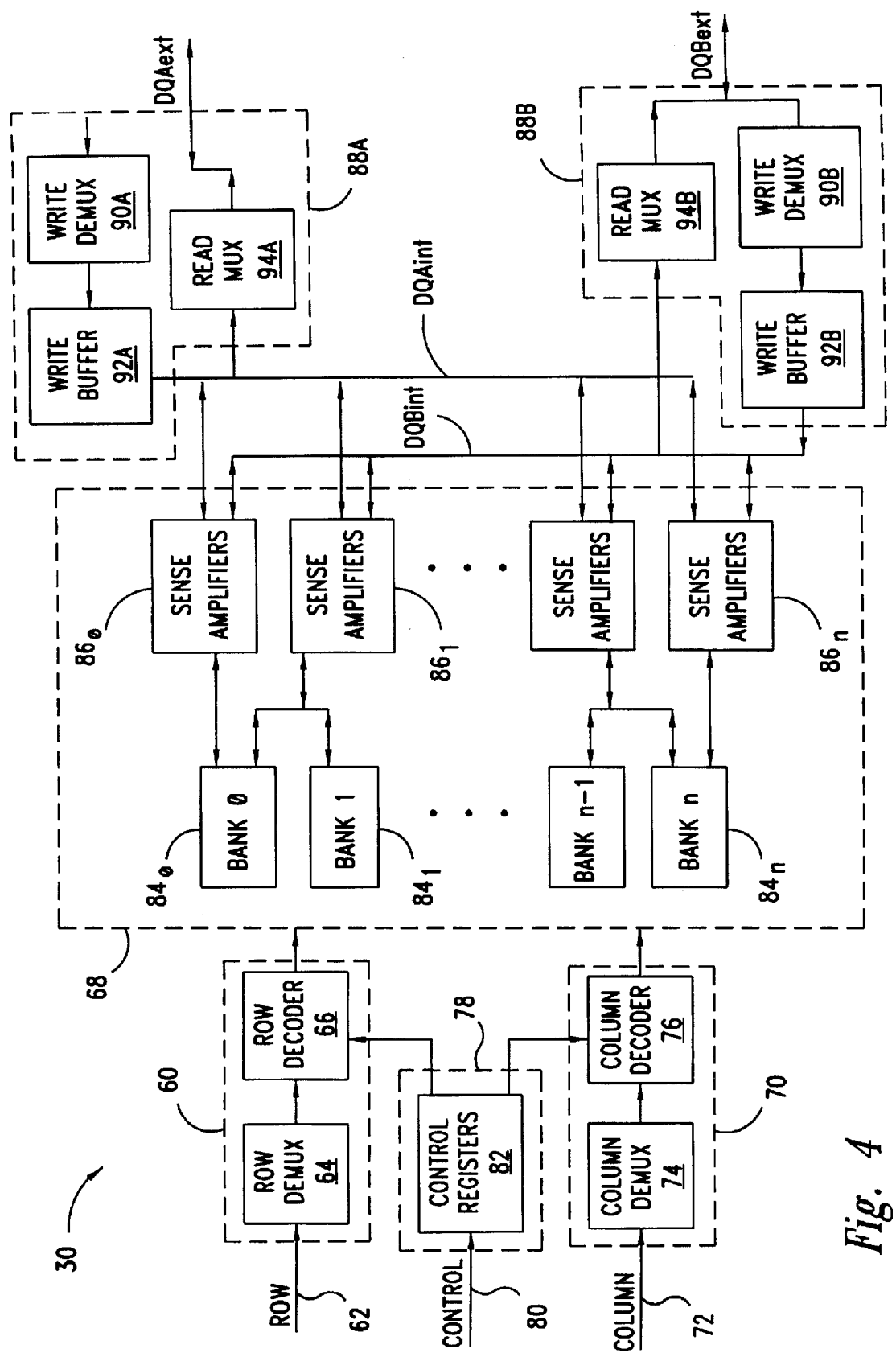
FIG. 4 is a block diagram of the memory circuit of FIG. 2 according to an embodiment of the invention.

FIG. 4 is a block diagram of an embodiment of the memory circuit 30 of FIG. 2. For example, the memory circuit 30 may be similar to a Direct RDRAM® 128/144-MBIT (256K×16/18×32S), which is described in more detail in the Advanced Information sheet available from Rambus Incorporated of Mountain View, Calif. or from the Rambus website at www.rambus.com. Because of its relatively high operating frequency, the memory circuit 30 uses two sets of clock signals, one set for clocking in signals received from the receiving of data from the system in which the circuit 30 is installed, and another set for clocking out signals to the system. For example, the set of clock signals CFM and $\overline{\text{CFM}}$ (FIG. 2) are used to clock in signals received from the system. For clarity, however, these sets of clock signals have been omitted from FIG. 4. Furthermore, the signals received from and sent to the system by the memory circuit 30 have voltage, logic-level, and frequency characteristics that are similar to those describe above for $S_0$–$S_n$ (FIG. 2).

The memory circuit 30 includes a row-decoding circuit 60 for receiving packets of row commands and addresses from a row bus 62. The row-decoding circuit 60 includes a row demultiplexer 64 for sequentially receiving portions of a row-information packet from the row bus 62 and presenting the row-information packet to a row decoder 66, which selects an addressed row of memory cells (not shown) in a memory array 68.

A column-decoding circuit 70 receives packets of column commands and addresses from a column bus 72. The column-decoding circuit 70 includes a column demultiplexer 74 for sequentially receiving portions of a column-information packet from the column bus 72 and presenting the column-information packet to a column decoder 76, which selects an addressed column of memory cells (not shown) in the memory array 68. For convenience, the combination of the row- and column-decoder circuits 60 and 70 can be referred to as an address decoder.

A control circuit 78 receives packets of control information from a control bus 80 and controls the row- and column-decoding circuits 60 and 70. The control circuit 78 includes control registers 82 for storing the control information, which includes, e.g., circuit-configuration information and a chip address assigned to the memory circuit 30 by the system in which the circuit 30 is installed.

The memory array 68 includes one or more memory banks 84$_0$–84$_n$, which each include one or more rows of memory cells, and includes a set of sense amplifiers 86$_0$–86$_y$, which write data to and read data from the respective banks 84$_0$–84$_n$. The sense amplifiers 86 receive write data from and provide read data to internal data busses DQAint and DQBint. In one embodiment, each sense amplifier 86 can read or write up to half a row at one time. Thus, two sense amplifiers 86 are respectively coupled to each bank 84 so that together these two sense amplifiers can write or read an entire row at one time. To reduce the number of sense amplifiers 86, the memory banks 84 share them. For example, the banks 84$_0$ and 84$_1$ share the sense amplifier 86$_1$.

A read/write circuit 88a transfers data between the internal data bus DQAint and an external data bus DQAext, and another read/write circuit 88b transfers data between the internal data bus DQBint and an external data bus DQBext. Both DQAext and DQBext communicate with the data bus of the system in which the memory circuit 30 is installed. The read/write circuit 88a includes a write demultiplexer 90a for serially receiving groups of write-data bits from DQAext and converting these groups into parallel data. A write buffer 92a receives the parallel write data from the demultiplexer 90a and provides it to DQAint. The read/write circuit 88a also includes a read multiplexer 94a, which receives read data from DQAint, converts the read data into groups of read-data bits, and sequentially provides these groups of read-data bits to DQAext. Likewise, the read/write circuit 88b includes a write demultiplexer 90b, a write buffer 92b, and a read multiplexer 94b.

Typically, some or all of the following above-described circuits include input buffers like the input buffers 18 and 20 of FIG. 2: the row-decoding circuit 60, the column-decoding circuit 70, the control circuit 78, and the read/write circuits 88a and 88b. Each of these circuits may include its own reference generator 32 and optional isolation buffer 38, or the memory circuit 30 may include one generator 32 and one optional isolator 38 for all of these circuits. For example, the control circuit 78 may include the generator 32 and optional isolator 38 for use by the entire memory circuit 30, and may receive CFM and $\overline{\text{CFM}}$ from the control bus 80.

In operation during an initialization cycle of the memory circuit 30, the control circuit 78 receives one or more control packets from the bus 80, stores the corresponding control information in the control registers 82, and configures the internal circuitry, operating mode(s), and chip address of the memory circuit 30.

During a read or write operation, the row-decoding circuit 60 sequentially receives portions of the row packet from the bus 62, each portion including one or more row-packet bits. For example, in one embodiment, the row bus 62 is three bits wide, and a row packet includes twenty four bits. Therefore, the decoding circuit 60 receives the row packet as eight sequential packet portions of three bits each. The row demultiplexer 64 sequentially receives these packet portions and arranges the packet bits in a parallel format. The row decoder 66 receives the row packet from the demultiplexer 64 in this parallel format and enables the bank 84 and the row within this bank that are specified by the row packet. The row decoder 66 also controls the memory array 68 to implement the row-transfer mode specified by the row packet. Generally, the row-transfer mode indicates how the selected bank and row transfer data from or to the respective sense amplifiers 86. Similarly, the column-decoding circuit 70 sequentially receives portions of the column packet from the bus 72, each portion including one or more column-packet bits. For example, in one embodiment, the column bus 72 is five bits wide and the column packet includes forty bits. Therefore, the decoding circuit 70 receives the column packet as eight sequential packet portions of five bits each. The column demultiplexer 74 sequentially receives these packet portions and arranges the packet bits in a parallel format. The column decoder 76 receives the column packet from the demultiplexer 74 in this parallel format and enables the column or columns that are specified by the column packet. The column decoder 76 also controls the memory array 68 to implement the column-transfer mode specified by the column packet. Generally, the column-transfer mode specifies how the sense amplifiers 86 transfer data to or from the busses DQAint and DQBint.

In operation during a read cycle, the respective sense amplifiers 86 provide half the data stored in the memory cells of the specified row and column or columns to the read multiplexer 94a and half to the read multiplexer 94b via DQAint and DQBint, respectively. The multiplexers 94a and 94b receive their respective data portions in parallel format, convert this parallel data into respective groups of bits, and sequentially provide these groups of bits to DQAext and DQBext, respectively. For example, in one embodiment, the busses DQAint and DQBint are both seventy two bits wide, and the busses DQAext and DQBext are both nine bits wide. Therefore, the read multiplexer 94a receives the seventy two read bits in parallel via DQAint and provides the read bits to DQAext as a sequence of eight groups of nine data bits each. Likewise, the read multiplexer 94b receives the seventy two read bits in parallel via DQBint and provides the read bits to DQBext as a sequence of eight groups of nine data bits each.

In operation during a write cycle, the write demultiplexers 90a and 90b sequentially receive respective groups of write data bits from DQAext and DQBext, respectively, and arrange these groups of data bits in a parallel format. For example, in the embodiment described above where DGAext and DQBext include nine bits each and DQAint and DQBint include seventy two bits each, the demultiplexers 90a and 90b each receive eight respective groups of data bits and convert then into respective seventy-two bit words. The write buffers 92a and 92b receive these words of write data from the demultiplexers 90a and 90b and provide them to DQAint and DQBint, respectively. The respective sense amplifiers 86 then write the data from DQAint and DQBint into the specified row and column or columns of memory cells in the array 68.

Figure 5:
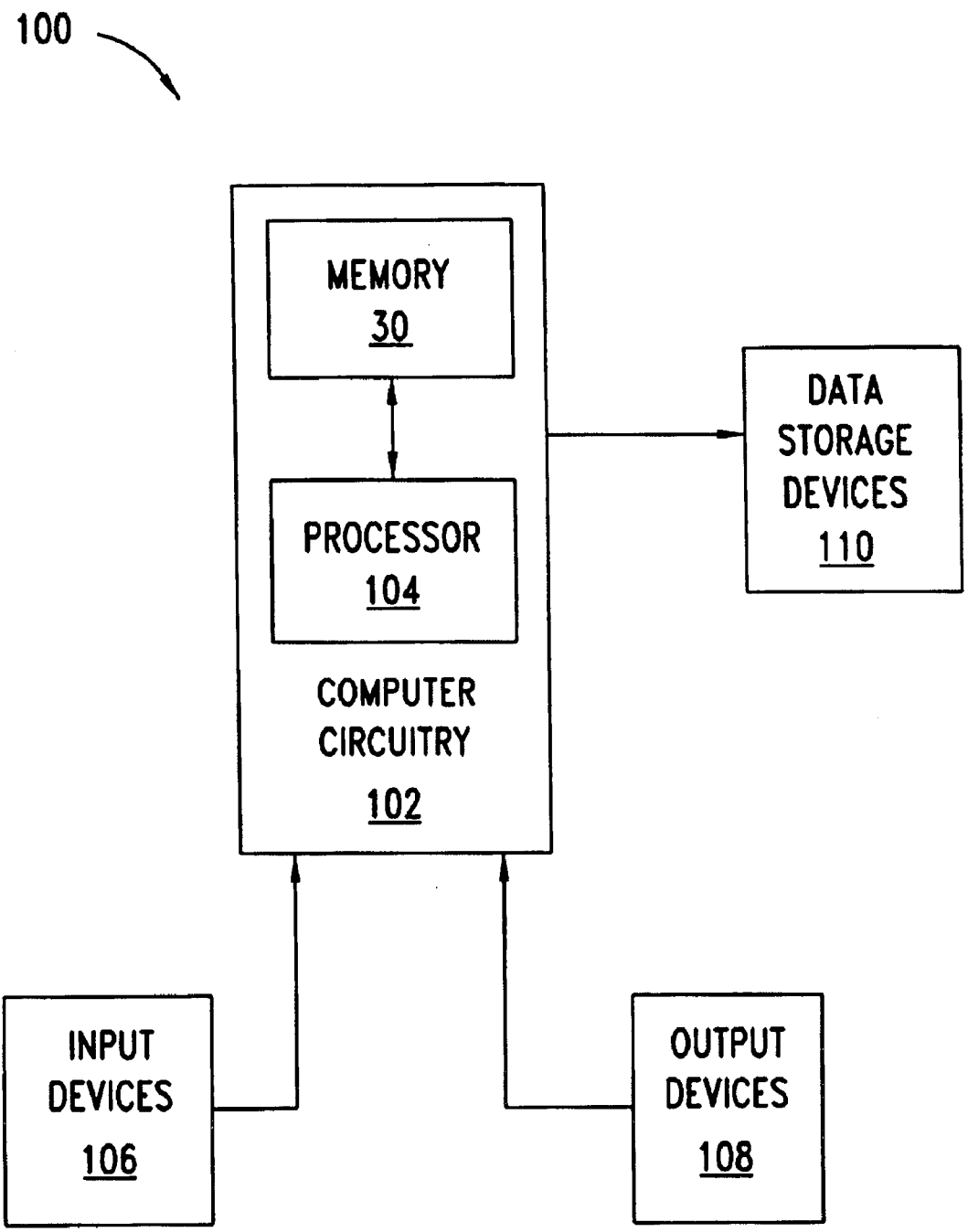
FIG. 5 is a block diagram of an electronic system that incorporates the memory circuit of FIGS. 2 and 4.

FIG. 5 is a block diagram of an electronic system 100, such as a computer system, that incorporates the memory circuit 30 of FIGS. 2 and 4. The system 100 includes computer circuitry 102 for performing computer functions such as executing software to perform desired calculations and tasks. The circuitry 102 typically includes a processor 104 and the memory circuit 30, which is coupled to the processor 104. One or more input devices 106, such as a keyboard, mouse, or microphone, are coupled to the computer circuitry 102 and allow an operator (not shown) to input data thereto. One or more output devices 108 are coupled to the computer circuitry 102 to provide to the operator data generated by the computer circuitry 102. Examples of such output devices 108 include a printer and a video display unit. One or more data-storage devices 110 are coupled to the computer circuitry 102 to store data on or to retrieve data from external storage media (not shown). Examples of such storage devices 110 and the corresponding storage media include drives that accept hard and floppy disks, tape cassettes, and compact disk read-only memories (CD ROMS). Typically, the computer circuitry 102 includes row, column, control, and data busses that are respectively coupled to the row bus 62, column bus 72, control bus 80, and data busses DQAext and DQBext of the memory device 30.

From the foregoing it will be appreciated that, although specific embodiments of the invention have been described herein for purposes of illustration, various modifications may be made without deviating from the spirit and scope of the invention.

What is claimed:

1. A method, comprising:
   receiving an input signal with an integrated circuit;
   generating a first reference signal within the integrated circuit during a first mode of operation; and
   processing a difference between the input signal and the first reference signal during the first mode of operation.

2. The method of claim 1 wherein the processing comprises
   amplifying the difference between the input signal and the first reference signal during the first mode of operation.

3. The method of claim 1, further comprising:
   receiving a second reference signal; and
   amplifying a difference between the input signal and the second reference signal during a second mode of operation.

4. The method of claim 1 wherein the first mode of operation comprises a test mode of operation.

5. The method of claim 1 wherein the first reference signal comprises a reference voltage.

6. A method, comprising:
   receiving an input signal with an integrated circuit;
   generating a first reference signal within the integrated circuit during a first operational mode; and
   comparing the input signal to the first reference sign with multiple differential amplifiers during the first operational mode.

7. The method of claim 6 wherein the first operational mode comprises a test mode.

8. The method of claim 6, further comprising:
   receiving a second reference signal with the integrated circuit; and
   comparing the input signal to the second reference signal with the differential amplifiers during a second operational mode.

9. The method of claim 6, further comprising:
   wherein the first operational mode comprises a test mode;
   receiving a second reference signal with the integrated circuit; and
   comparing the input signal to the second reference signal with the differential amplifiers during a nontest mode.

10. The method of claim 6, further comprising:
    receiving a first clock signal with one of the differential amplifiers; and
    receiving a second dock signal with another one of the differential amplifiers.

11. The method of claim 6, further comprising:
    receiving a first clock signal with one of the differential amplifiers, the first clock signal having a first phase; and
    receiving a second clock signal with another one of the differential amplifiers, the second clock signal having a second phase.

12. The method of claim 6, further comprising:
    receiving a first clock signal with one of the differential amplifiers, the first clock signal having a phase; and
    receiving a second clock signal with another one of the differential amplifier, the second clock signal having a phase that is shifted 180° or approximately 180° from the phase of the first clock signal.

13. A method, comprising:
    receiving a first reference signal and an address signal with a memory circuit;
    generating a second reference signal within the memory circuit;
    processing the address signal and the first reference signal during a first operating mode of the memory circuit; and
    processing the address signal and the second reference signal during a second operating mode of the memory circuit.

14. The method of claim 13 wherein:
    the first operating mode comprises a nontest mode; and
    the second operating mode comprises a test mode.

15. The method of claim 13 wherein:
    the processing the address signal and the first reference signal comprises amplifying a difference between the address signal and the first reference signal during the first operating mode; and
    the processing the address signal and the second reference signal comprises amplifying a difference between the address signal and the second reference signal during the second operating mode.

16. A method, comprising:
    receiving a first reference signal and a data signal with a memory circuit;
    generating a second reference signal within the memory circuit;
    processing the data signal and the first reference signal during a first operating mode of the memory circuit; and
    processing the data signal and the second reference signal during a second operating mode of the memory circuit.

17. A method, comprising:

receiving a first reference signal and a control signal with a memory circuit;

generating a second reference signal within the memory circuit;

processing the control signal and the first reference signal during a first operating mode of the memory circuit; and processing the control signal and the second reference signal during a second operating mode of the memory circuit.

18. A method, comprising:

receiving an input signal and a first reference signal with an integrated circuit;

generating a second reference signal within the integrated circuit;

during a first time period of a nontest mode of the integrated circuit, amplifying a difference between the input signal and the first reference signal with a first amplifier;

during a second time period of the nontest mode, amplifying the difference between the input signal and the first reference signal with a second amplifier;

during a first time period of a test mode of the integrated circuit, amplifying a difference between the input signal and the second reference signal with the first amplifier; and during a second time period of the test mode, amplifying the difference between the input signal and the second reference signal with the second amplifier.

19. The method of claim 18 wherein:

the first and second time periods of the nontest mode do not overlap; and the first and second time periods of the test mode do not overlap.

20. A method, comprising:

receiving an input signal and a first reference signal with an integrated circuit;

generating a second reference signal within the integrated circuit;

during a first time period of a nontest mode of the integrated circuit, comparing a difference between the input signal and the first reference signal with a first circuit;

during a second time period of the nontest mode, comparing the difference between the input signal and the first reference signal with a second circuit;

during a first time period of a test mode of the integrated circuit, comparing a difference between the input signal and the second reference signal with the first circuit; and during a second time period of the test mode, comparing the difference between the input signal and the second reference signal with the second circuit.

21. An integrated circuit, comprising:

first and second external integrated-circuit terminals operable to respectively receive an input signal and a first reference signal;

a reference circuit operable to generate a second reference signal; and a differential amplifier having a first terminal coupled to the first external terminal and having a second terminal coupled to the second external terminal and to the reference circuit, the differential amplifier operable to amplify a difference between the input signal and the first reference signal during a nontest mode and to amplify a difference between the input signal and the second reference signal during a test mode.

* * * * *

UNITED STATES PATENT AND TRADEMARK OFFICE
CERTIFICATE OF CORRECTION

PATENT NO.    : 6,407,955 B2                                              Page 1 of 1
DATED         : June 18, 2002
INVENTOR(S)   : Troy Manning It is certified that error appears in the above-identified patent and that said Letters Patent is hereby corrected as shown below:

Column 7,
Line 47, please move the text beginning with "amplifying" through to the end of the claim up one line to follow "comprises", making claim 2 one paragraph.
Line 62, please delete "sign" and insert -- signal --.

Column 8,
Line 16, please delete "dock" and insert -- clock --.
Line 29, please delete "amplifier" and insert -- amplifiers --.

Signed and Sealed this

Fourteenth Day of January, 2003

JAMES E. ROGAN
*Director of the United States Patent and Trademark Office*